United States Patent [19]

Ishii

[11] Patent Number: 5,685,942
[45] Date of Patent: Nov. 11, 1997

[54] PLASMA PROCESSING APPARATUS AND METHOD

[75] Inventor: Nobuo Ishii, Yamanashi-ken, Japan

[73] Assignee: Tokyo Electron Limited, Tokyo, Japan

[21] Appl. No.: 566,154

[22] Filed: Dec. 1, 1995

[30] Foreign Application Priority Data

Dec. 5, 1994 [JP] Japan .................... 6-330245

[51] Int. Cl.$^6$ .................................. H01L 21/00
[52] U.S. Cl. ........................... 156/345; 216/67
[58] Field of Search ................ 216/67, 68, 69; 156/643.1, 345; 204/298.34

[56] References Cited

U.S. PATENT DOCUMENTS 5,540,800  7/1996  Qian ........................ 204/298.34 X
5,556,501  9/1996  Collins et al. ................ 204/298.34
5,571,366  11/1996  Ishii et al. ........................ 216/68

*Primary Examiner*—William Powell
*Attorney, Agent, or Firm*—Oblon, Spivak, McClelland, Maier & Neustadt, P.C.

[57] ABSTRACT

A plasma processing apparatus comprises a chamber for storing an object, a gas supply unit for supplying processing gas into the chamber, and high-frequency antenna, provided at least either the inside or outside of the chamber to oppose the object, for generating processing gas supplied into the chamber for processing the object, a high-frequency power source for supplying high-frequency power to the high-frequency antenna, and an electrode, provided to oppose the object and to be insulated from the high-frequency antenna and set at a reference potential, for providing a uniform electric field above the object.

11 Claims, 5 Drawing Sheets

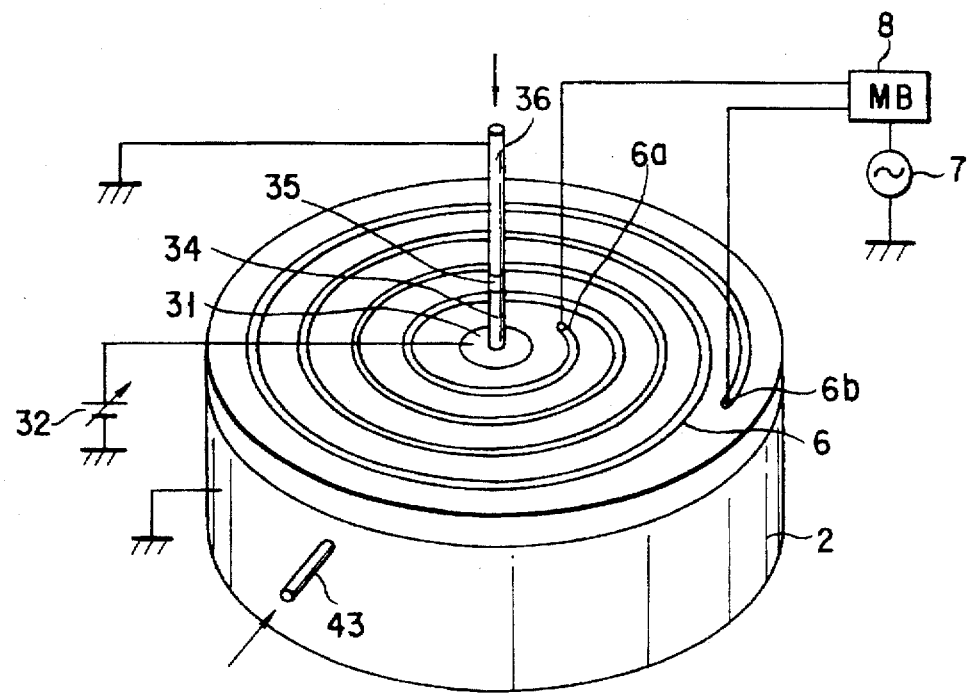
F I G. 2
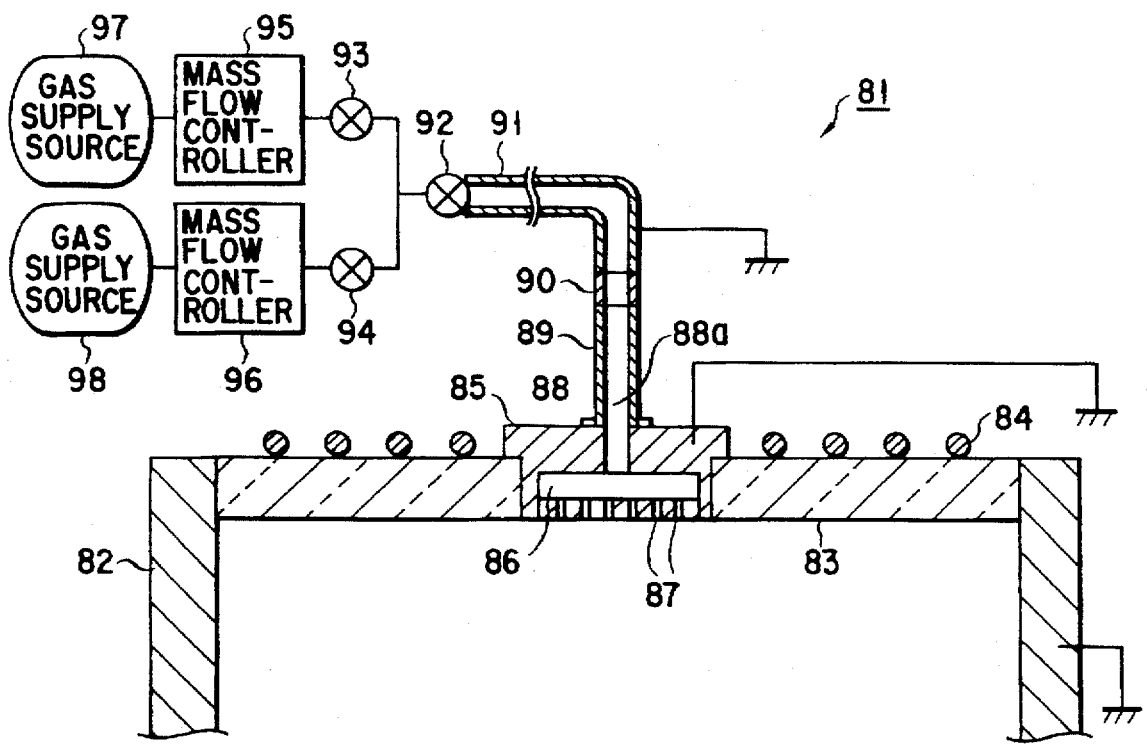
F I G. 4

PLASMA PROCESSING APPARATUS AND METHOD

BACKGROUND OF THE INVENTION

1. Field of the Invention

The present invention relates to a plasma processing apparatus and a plasma processing method.

2. Description of the Related Art

A parallel plate type plasma processing apparatus using high frequency (RF) waves has been widely utilized for plasma-processing, e.g., a semiconductor wafer (which will be referred to as "wafer" hereinafter) in a processing chamber. It has a structure in which plasma is generated between the parallel plate electrodes by applying high frequency to one of or both of the electrodes, and a plasma flow is made incident on the processed surface of the object by the self bias potential difference between the plasma and the object to thereby carry out, for example, etching processing to the object.

Ultra fine processing, using the conventional plasma processing apparatus such as a parallel plate type plasma processing apparatus, in units of sub-micron or even sub-half micron has been increasingly in demand as ultra-high integrated semiconductor devices are produced. It is, however, difficult to execute it. To do so using the plasma processing apparatus, it is essential to control high-density plasma with high precision in a low-temperature atmosphere. Also, it is necessary for the plasma to have an expansive area as well as high uniformity so as to deal with a wafer having a large diameter. Furthermore, if electrodes are used in the plasma processing apparatus, they cause heavy metal contamination per se at the time when plasma occurs. Ultra fine processing has been, in particular, confronted by the heavy metal contamination problem.

Although magnetron plasma etching or growing means have been proposed to meet these technical requirements, they are not enough to avoid damage to the wafer W. A variety of approaches have been made so far to establish a new plasma source causing no damage to the wafer W. For instance, the European Patent Publication No. 379828 discloses a high-frequency induction plasma generation apparatus using a high-frequency antenna.

This high-frequency induction plasma generation apparatus has a structure in which the surface of a processing chamber, which opposes a wafer holding base, is made of insulating material such as quartz glass and an outer wall surface thereof is equipped with a high-frequency antenna constructed by, e.g. a spiral coil. High-frequency power is applied to the high-frequency antenna to thereby form a high frequency electromagnetic field in the processing chamber, to ionize gas by colliding electrons flowing in the electromagnetic field space with neutral particles of the processing gas, and to thereby generate plasma.

Meanwhile, if plasma processing is carried out using the above-mentioned high-frequency induction type plasma processing apparatus, the density of plasma induced in the processing housing tends to become irregular, particularly, in the radial direction. In the case of carrying out plasma processing with ultra-high precision as high as a sub-half micron, it is necessary to generate plasma with high density, uniformity and reproducibility in the processing housing. Therefore, the technique of providing uniform plasma density with high precision by the use of the high-frequency induction type plasma processing apparatus has to be urgently established.

SUMMARY OF THE INVENTION

An object of the present invention is to provide an improved plasma processing apparatus and method which can control, with strong precision, plasma having high density, high uniformity and high reproducibility.

Another object of the present invention is to provide an improved plasma processing apparatus and method which can provide a uniform reaction speed if used in etching processing and which can carry out plasma processing with the same reaction speed between the center and periphery of the object.

According to the present invention, there is provided a plasma processing apparatus, comprising: a chamber storing an object; gas supply means for supplying processing gas into the chamber; a high-frequency antenna, provided at least one of the inside and outside of the chamber to oppose the object, for generating processing gas supplied into the chamber for processing the object; a high-frequency power source for supplying high-frequency power to the high-frequency antenna; and an electrode provided to oppose the object and to be insulated from the high-frequency antenna and set at a reference potential, for providing a uniform electric field above the object.

According to the present invention, there is provided a plasma processing apparatus comprising: a chamber for storing the object; gas supply means for supplying processing gas to a central portion of the object to provide a uniform gas flow above the object within the chamber; a high-frequency antenna, provided at least either the inside or outside of the chamber to oppose the object, for generating processing gas supplied into the chamber for processing the object; and a high-frequency power source for supplying high-frequency power to the high-frequency antenna.

According to the present invention, there is provided a plasma processing method comprising the steps of: supplying processing gas into a chamber in which an object is stored; supplying high-frequency power to a high-frequency antenna, provided at least one of the inside and outside of the chamber to oppose the object, for generating processing gas supplied into the chamber for processing the object; and applying a ground potential to an electrode, provided on a central portion of the object, for providing a uniform electric field above the object.

According to the present invention, there is provided a plasma processing method comprising the steps of: supplying processing gas to a central portion of an object, which is stored in a chamber, to provide a uniform processing gas flow above the object; and supplying high-frequency power to a high-frequency antenna, provided at least one of the inside and outside of the chamber to oppose the object, for generating processing gas supplied into the camber for processing the object.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a perspective view of the plasma etching equipment of FIG. 1;

FIG. 4 is a partially sectional view showing plasma etching equipment according to the second embodiment of the present invention;

DETAILED DESCRIPTION OF THE PREFERRED EMBODIMENTS

Figure 1:
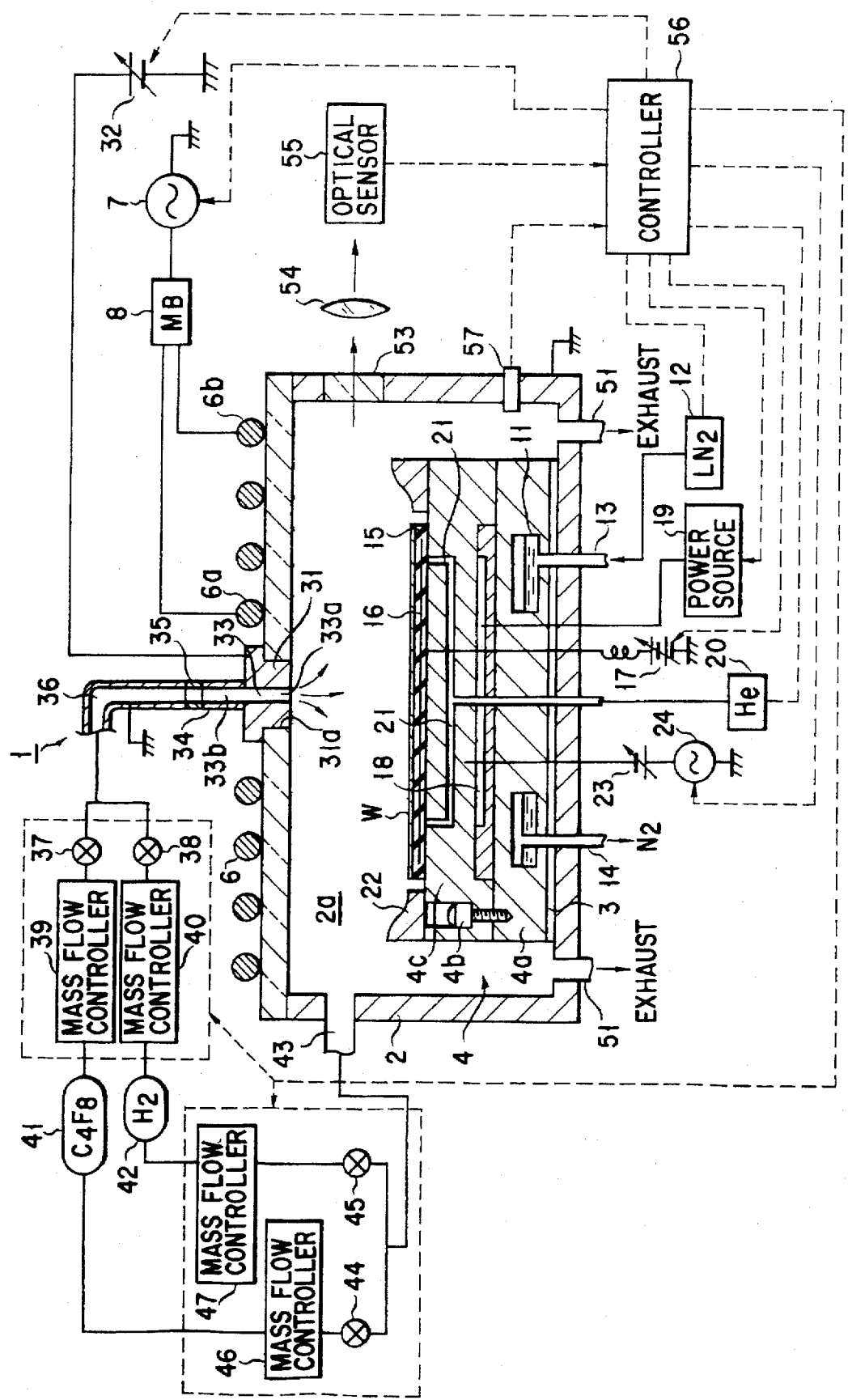
FIG. 1 is a schematically sectional view showing plasma etching equipment according to the first embodiment of the present invention.

Preferred embodiments of a plasma processing apparatus according to the present invention will now be described with reference to appended drawings. A plasma etching equipment 1 shown in FIG. 1 includes a processing housing 2 molded into a circular cylinder or a rectangular cylinder out of conducting material such as aluminum. Predetermined etching process is carried out in a processing chamber 2a formed in the processing housing 2.

The processing housing 2 is grounded and provided with a substantially cylindrical holding base 4 for holding an object, e.g. a semiconductor wafer W at its base via an insulating plate made of, e.g. ceramics. An insulating material 5 made of, e.g. quartz glass or ceramics is provided airtightly on the upper plate of the processing housing 2 which almost opposes the holding surface of the wafer W held on the holding base 4. A high frequency antenna 6 is formed into spiral, coil or loop shape out of a conductor, e.g. a copper plate, aluminum or stainless steel, is arranged on the outer wall of the insulating material 5. The antenna 6 can do with only having a function to generate plasma, and if frequency is high, it might be enough for the antenna to be coiled only once.

As shown in FIG. 2, terminals 6a and 6b of the high frequency antenna 6 are connected to a high frequency power source 7 for generating plasma through a matching circuit 8. Since the matching circuit 8 adjusts current values, the alternating electric field, that is, plasma density can be controlled depending on the amount of current flowing through the antenna 6.

The holding base 4 mainly consists of a susceptor holding base 4a, which is molded into a cylindrical shape out of aluminum, and a susceptor 4c which is detachably provided on the susceptor holding base 4a by a bolt 4b. The detachably provided susceptor 4a helps easy maintenance.

A temperature adjuster, such as a cooling jacket 11, is provided on the susceptor holding base 4a. Refrigerant such as liquid nitrogen is introduced from a refrigerant source 12 into the jacket 11 by way of a refrigerant intake pipe 13. Nitrogen gas resulting from liquid nitrogen which has been vaporized by means of heat exchange when circulating through the cooling jacket 11 is discharged from the refrigerant exhaust pipe 14 outside of the processing housing 2. With this structure, cold of liquid nitrogen with a temperature of, e.g. −196° C. is transferred from the cooling jacket 11 to the semiconductor wafer W through the susceptor 4c, making it possible to cool the processed surface of the wafer W down to a desired temperature.

An electrostatic chuck 15, which has almost the same area as that of the wafer, is formed on the wafer holding portion on the upper surface of the susceptor 4c molded substantially into a cylindrical shape. The electrostatic chuck 15 is formed, for instance, by sandwiching a conducting film 16, e.g. a copper foil, between two polymeric polyimide films in an insulating manner. The conducting film 16 is connected to a variable DC voltage source 17 by a lead line. The semiconductor wafer W is adhered to and held on the upper surface of the electrostatic chuck 15 by coulomb force.

A moisture adjusting heater 18 is provided at the bottom of the susceptor 4C between the electrostatic chuck 15 and the cooling jacket 12. The transfer of cold from the cooling jacket is controlled by adjusting power supplied from a power source 19 to the moisture adjusting heater 18, thereby making temperature control of the processed surface of the semiconductor wafer W possible.

A gas flow path 21 is formed through the susceptor holding base 4a and the susceptor 4c to supply heat-transfer gas (or back cooling gas), e.g. He, from a gas source 20 to the reverse face of the semiconductor wafer W or to coupling portions of elements of the susceptor 4c. A focusing ring 22 is arranged on the upper edge portion of the susceptor 4c in such a manner as to surround the semiconductor wafer W. The focusing ring 22 is made of a high-resistant element which does not attract reaction gas, such as ceramics or quartz glass. The ring 22 serves to make the reaction gas effectively incident on the semiconductor wafer W only.

The susceptor 4c is connected to a high-frequency power source 24 through a matching capacitor 23. While processing is going on, a bias potential occurs between the susceptor 4c and plasma if applying high-frequency power of, e.g. 2 $MH_z$ to the susceptor 4c, so that a plasma stream is attracted effectively to the processed surface of the object.

A ground electrode 31 made of a conductor or a semiconductor is provided at the center of the high-frequency antenna 6 through the insulating material 5 of the processing housing 2 airtightly. The same material as that of the processing holding 2, i.e., aluminum can be used for the ground electrode 31. Si single crystal, SiC or C, which are the same material as that of the semiconductor wafer, can be also used as a material to prevent heavy metal contamination.

The ground electrode 31 is connected in series to a variable load circuit device 32. The variable load circuit device 32 can control the potential of the ground electrode 31 by adjusting the load. This makes it possible to control the intensity of the bias field occurring at the center of the semiconductor wafer W to be the same as the field intensity of the peripheral portion, thereby controlling the bias field of the plasma occurring in the processing housing 2 to be uniform.

If the object, that is, semiconductor wafer W is 8 inches in size, the diameter of the ground electrode 31 is set at around 80 mm. Since the size of the ground electrode 31 is determined depending on the processing types or the like, it may be larger than the object. The bottom surface 31a of the ground electrode 31 is molded to be flush with the surface of the insulating material 5.

A processing gas supply path 33 is formed perpendicularly within the ground electrode. The outlet of the supply path 33, that is, the opening portion on the side of the processing chamber 2a serves as a supply port 33a, the inlet thereof, that is, the opening portion on the side of the outside of the processing housing 2 as a gas inlet 33b. A first conductive supply pipe 34 is connected to the first supply pipe 34. A second supply pipe 36 is connected to the gas inlet 33b through an insulating material 35, and is grounded. Thus, high frequency to be applied to the first supply pipe 34 is interrupted by the insulating material 35, thereby stabilizing the operation of the ground electrode.

The second supply pipe 36 is connected, through valves 37 and 38 and mass flow controllers 39 and 40, to processing gas supply sources 41, 42. In this embodiment, $C_4F_8$ gas is supplied from the processing gas supply source 41 and $H_2$ gas from the processing gas supply source 42.

A gas supply pipe 43 made of quartz glass or ceramics is provided on the side surface of the processing housing 2 above the susceptor 4c. The pipe 43 is connected, via the valves 44, 45 and mas flow controllers 46 and 47, to the processing gas supply sources 41 and 42, as well.

Figure 3:
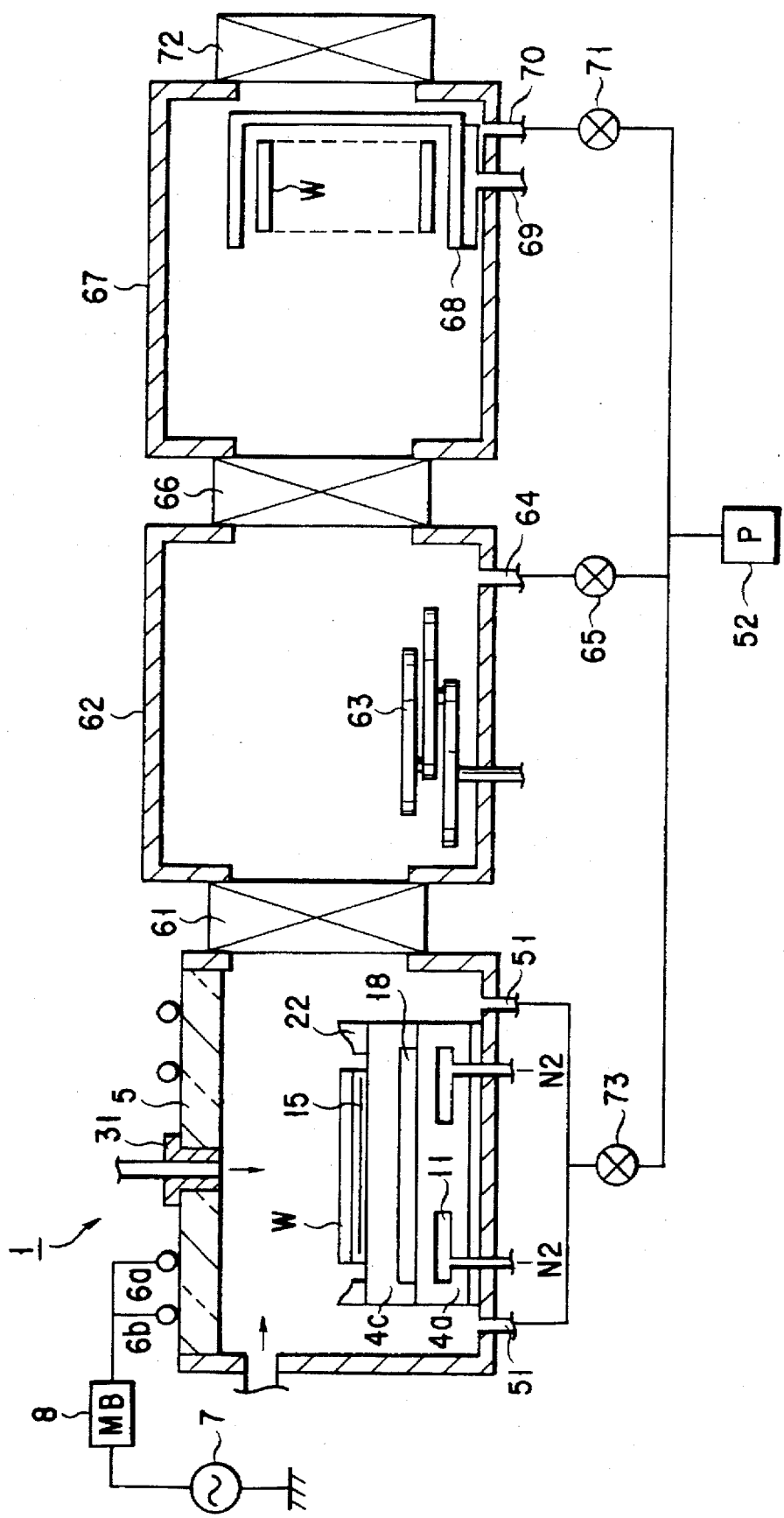
FIG. 3 is a schematically sectional view showing the plasma etching equipment and peripheral apparatuses thereof.

An exhaust pipe 51 is connected to the bottom of the processing housing 2. As shown in FIG. 3, since the atmosphere within the processing housing 2 can be exhausted by a vacuum pump 52 through a vacuum exhaust valve 73, the atmosphere of the processing chamber 2a can be reduced to an arbitrary pressure.

Next, the structure of the control system of the plasma etching equipment 1 having the above-mentioned structure will be described.

A transparent window 53 made of transparent material such as quartz glass is provided on one of the side walls of the processing housing 2. Light within the processing chamber 2a is transmitted to an optical sensor 55 through an optical system 54. From the optical sensor, a signal relating to an emission spectrum generated from the processing chamber 2a is sent to a controller 56. The processing housing 2 is also provided with a sensor 57, a signal relating to pressure in the processing chamber 2a is sent to the controller 56.

The controller 6 sends control signals to the high frequency power source 7 for generating plasma, the variable load circuit equipment 32, a high frequency power source 24 for generating bias voltage, the refrigerant source 12, the power source 19 for adjusting temperature and the back cooling gas source 20, based on a feedback signal from the optical sensor 55 and the sensor 57 and on a present value. The present invention has control in such a way that the potential of the ground electrode 31 and a reaction speed are variable, enabling the optimum adjustment of the operational environment of the apparatus. Further, since the controller 56 controls the processing gas mass flow controllers 39, 40, 47 and 46, the flow rate of the processing gas from the supply port 33a of the ground electrode 31 and from the gas supply pipe 43 can be freely adjusted.

Peripheral machines and apparatuses of the plasma etching equipment 1 will be described with reference to FIG. 3. As shown therein, a load lock chamber 62 is adjacent to and connected via a gate valve 61 which opens and closes freely, to one of the side walls of the processing housing 2 of the plasma etching equipment 1. A transfer machine 63 having a transfer arm which is made of, for example, aluminum and is coated with conductive Teflon to be resistant to electrostatic, is provided in the load lock chamber 62. An exhaust pipe 64 is connected to the load lock chamber 62 from the exhaust port provided on the bottom surface thereof, and the atmosphere of the chamber 62 can be reduced to a vacuum by a vacuum pump 5 by way of a vacuum exhaust valve 65.

A cassette chamber 67 is adjacent and connected to the side wall of the load lock chamber 62 through a gate valve 62 which opens and closes freely. In the cassette chamber 67, a holding base 69 is provided for holding a cassette 68. The cassette 68 can store 25 semiconductor wafers W as one lot. An exhaust pipe 70 is connected to the exhaust port provided on the bottom surface of the cassette chamber 67, whose atmosphere can be reduced to a vacuum by the vacuum pump 52 by way of a vacuum exhaust valve 71. The other side wall of the cassette chamber 67 is brought into contact with the air through the gate valve 72 which freely opens and closes.

The operation of the plasma etching equipment 1 having the above-mentioned structure will be described.

The gate valve 72, which contacts the air, is opened. The cassette 68 which stores the object, i.e. semiconductor wafers W is held on the holding base 69 by a transfer robot (not shown). Then, the vacuum exhaust valve 71 connected to the cassette chamber 67 is opened, and the atmosphere of the chamber 67 is reduced to a predetermined vacuum atmosphere, e.g. $1 \times 10^{-1}$ Torr.

Furthermore, the gate valve 66 provided between the load lock chamber 62 and the cassette chamber 67 is opened. A semiconductor wafer W is taken out from the cassette 68 mounted in the cassette chamber 67, and is transferred to the load lock chamber 62 by the transfer machine 63. The gate valve 66 is closed. The vacuum exhaust valve 65 connected to the load lock chamber 62 is opened, and the atmosphere of the load lock chamber 62 is reduced to a predetermined vacuum atmosphere, e.g. $1 \times 10^{-3}$ Torr by the vacuum pump 52.

Next, the gate valve 66 provided between the load lock chamber 62 and the processing housing 2 is opened. The semiconductor wafer W is transferred into the processing chamber 2a of the processing housing by the transfer machine 63, and is passed on to a pusher pin (not shown) on the susceptor 4c. After the transfer machine 63 returns into the load lock chamber 62, the gate valve 66 is closed. Later, a high DC voltage applied to the electrostatic chuck 15, and the semiconductor wafer W is held on the electrostatic chuck 1 by descending the pusher pin, thereby fixedly holding the semiconductor wafer W on the susceptor 4c. During that period, the vacuum valve 73 is opened and the atmosphere of the processing housing 2 is reduced to a predetermined vacuum atmosphere, e.g. $1 \times 10^{-5}$ Torr using the vacuum pump 44.

Moreover, while heat-transfer (back cooling) gas is being supplied to the reverse surface of the semiconductor W and to the coupling portion of the holding base 4, cold is supplied from the cooling jacket 11 to cool the processed surface of the semiconductor wafer W to a desired temperature. After that predetermined amounts of $C_4F_8$ and $H_2$ gas are introduced into the processing chamber 2a through the supply port 33a of the ground electrode 31 provided above the processing chamber 2a and the gas supply pipe 43 provided on the upper side of he processing chamber 2a, respectively.

After the sensor 57 senses that the processing chamber 2a comes to an optimum pressure atmosphere for providing an optimum etching speed which has been calculated using a dummy wafer in advance, a high-frequency power of, e.g. 13.56 $MH_Z$ is applied to the high-frequency antenna 6 through the matching circuit 8, resulting in the excitation of plasma in the processing chamber 2a. Then, the bias potential is applied to the holding base 4 by the high-frequency power source 24, whereby the semiconductor wafer W is etched. At that time, if the inner wall of the processing chamber 2a is heated to temperatures of 50° C. to 100° C., or preferably to 60° C. to 80° C., reaction products can be prevented from being adhered to the inner wall of the processing housing 2.

While etching processing is carried out, control signals are sent from the controller 56 to the high-frequency power source 7, the matching circuit 8, variable load circuit device 10 and the high-frequency power source 24 for bias potential, based on the feedback signal from the optical sensor 55 and sensor 57 which observe the environment within the processing housing 2 or on a preset value, thereby controlling the potential of the high-frequency antenna 6 or the potential of the ground electrode 31. In this way, as plasma in the processing housing 2 maintains high density and uniformity, processing conditions are kept at an optimum. if the controller 56 judges that the predetermined etching process is completed, then the application of the high-frequency energy and the supply of the processing gas are stopped and the plasma processing operation is completed.

Since the ground electrode 31 is provided at the center of the high-frequency antenna 6, or, at the portion which opposes the central portion of the semiconductor wafer W, the central portion has an intensified bias field to be equal to that of the peripheral portion. In this respect, therefore, the etching processing is uniformly performed.

Besides, from the processing gas supply path 33, which is formed in the ground electrode 31, the processing gas is introduced into the processing chamber 2a via the supply port 33a and is blown on the semiconductor wafer W. The processing gas is orientated from the center to the periphery of the semiconductor wafer W, with the result that the gas flows uniformly on the semiconductor wafer W. According to this embodiment of the present invention, therefore, etching processing is performed uniformly in terms of the gas flow, too.

In addition, according to this embodiment, the processing gas can be introduced from the gas supply pipe 43 provided on the upper side of the processing chamber 2a. This makes it possible to control the flow of gas with smaller particles, thereby to realize further improved uniformity of the etching processing.

As can be seen from the above, the etching equipment 1 according to this embodiment is designed to enhance the uniformity of the etching processing. For instance, in the conventional induction plasma processing apparatus, an etching rate is higher in the peripheral portion of the semiconductor wafer W, whereas in the present invention, the imbalance of the etching rate is greatly improved to enable an increase in yield.

In this embodiment, the gas supply pipe 43 is provided on the upper side of the processing chamber 2a. However, without it, if processing gas is introduced only from the gas supply port 33a of the supply path provided in the ground electrode 31, the uniformity of gas flow and consequently the uniformity of gas processing are, still, improved a lot more than the conventional apparatus.

Although this embodiment gives one supply port 33a at the supply path 33, the supply port 33a can be formed into a shower head shape. FIG. 4 illustrates a schematically sectional view of the principal part of the plasma etching equipment 81 according to another embodiment wherein the ground electrode of the shower head is used. An insulating material 83 is provided airtightly on the upper plate of the processing housing 82 of a plasma etching equipment 81. A high frequency antenna 81 for exciting plasma is arranged on the upper surface of the insulating material 83.

A ground electrode 85 is provided through the insulating material 83 at the center of the high frequency antenna 84. The ground electrode 85 is connected directly to a GND not through a variable load circuit equipment. A hollow portion 86 is formed in the electrode 85. A plurality of supply ports 87 leading to the hollow portion 86 are formed radially or coaxially below the hollow portion 86. A supply path 88 leading to the hollow portion 86 is formed above the hollow portion 86, and the upper surface of the supply path 88 serves as a gas inlet 88a.

A first conductive supply pipe 89 is connected to the gas inlet 88a. The first supply pipe 89 is connected to a second conductive supply pipe 91 through an insulating member 90. The second supply pipe 90 is grounded and connected to processing gas supply sources 97 and 98 through valves 93 and 94 and mass flow controllers 95 and 96.

Since the principal part of the plasma etching equipment 81 has the above structure, the ground electrode 85 contributes to intensifying the central portion of the bias field as in the case of the plasma etching equipment 1 according to the first embodiment of the present invention. Following this, the etching rate of the central portion of the object, that is, semiconductor wafer W is increased, resulting in an increase in the uniformity of the surface etching as a whole.

Additionally, processing gas introduced into the processing housing 82 from the processing gas supply sources 97 and 98 is uniformly supplied from a lot of supply ports 87 formed at the ground electrode 85 to the processed surface of the semiconductor wafer W which opposes the supply ports 87. As a result, the direction of the gas flow above the semiconductor wafer W is determined and thereby the uniform gas flow is obtained. From this, too, it is clear that the uniformity of the etching processing is enhanced in the present invention. Note, the above-mentioned supply ports are not necessarily the same in diameter. They may be set such that the larger the diameter of those closer to the center, the smaller the diameter of those closer to the peripheral portions. It is also possible to make the distribution width of the supply ports 87 larger than the surface width of the object in order to supply gas more uniformly.

Figure 5:
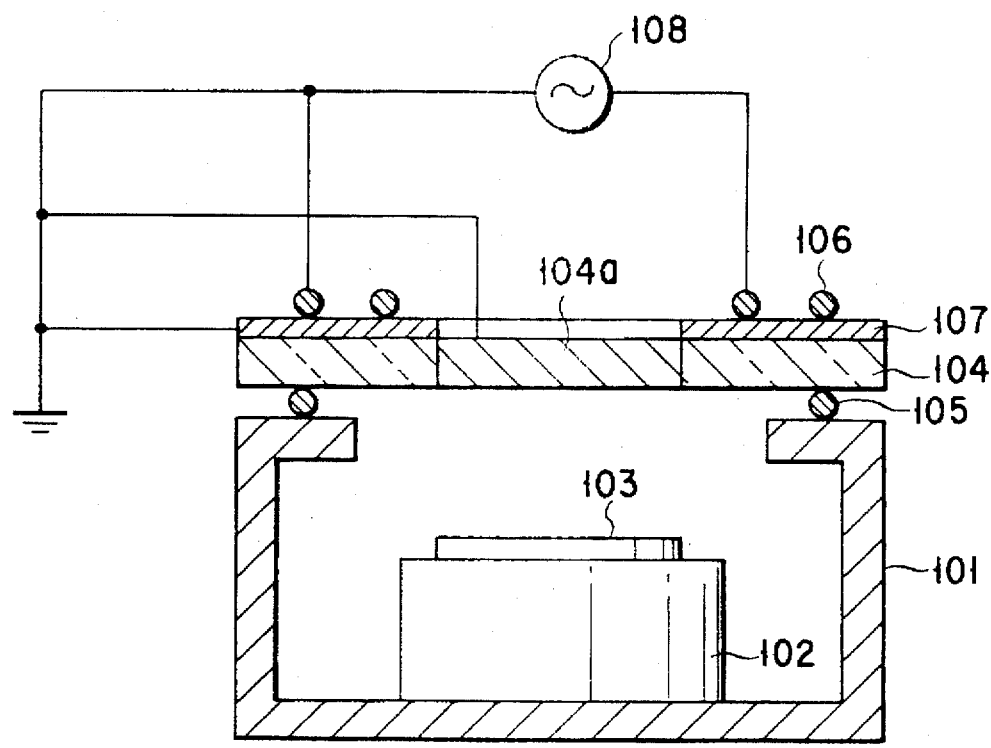
FIG. 5 is a schematically sectional view of the plasma etching equipment according to the third embodiment of the present invention.
Figure 6A:
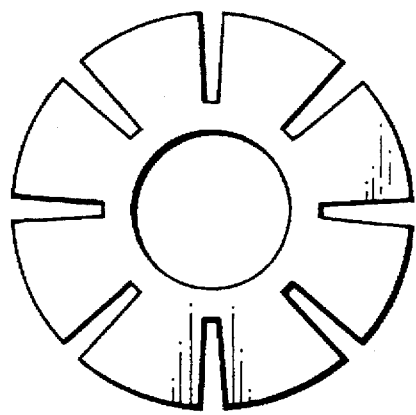
FIGS. 6A and 6B are plan views showing an electrostatic shield plate used in the plasma equipment shown in FIG. 5.
Figure 6B:
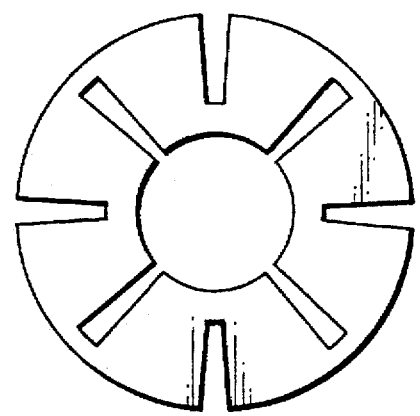

The third embodiment will be described with reference to FIG. 5. According to this embodiment, a dielectric upper plate 104 is provided airtightly by way of an O ring 105 above a processing housing 101 which stores a holding base 102 for holding a semiconductor wafer 103. A ground electrode 104a is provided airtightly at the center of the upper plate 104 in such a manner as to be flush with the upper plate 104. The ground electrode 104a is formed to be larger in size than the diameter of the semiconductor wafer 103. Between the upper plate 104 and an induction coil 106, an electrostatic shield 107 is provided. The induction coil 106 is connected between a high frequency power source 108 and a grounded terminal. To the grounded terminal, the ground electrode 104a of the upper plate 104 and an electrostatic shield 107 are connected. The electrostatic shield 107 comprises, as shown in FIGS. 6A and 6B, a disc-shaped shield plate provided with slits.

In a case where no electrostatic shield plate 107 is provided unlike this embodiment, it happens that when high frequency electric power is supplied from the high frequency power source 108 to the induction coil 106, a high frequency field generated by the induction coil 106 is coupled to the ground electrode 104a. The field causes sputtering of the dielectric upper plate 104 by positive ions within plasma, following that dust, which occurs in the processing housing 101, is adhered to the semiconductor wafer 103. Contrarily, in the case of providing between the upper plate 104 and the induction coil 106, the electrostatic shield 107 set at a ground potential, the electric field generated by the induction coil 106 is shielded by the electrostatic shield 107, preventing above-mentioned sputtering from occurring.

Figures 7, 8:
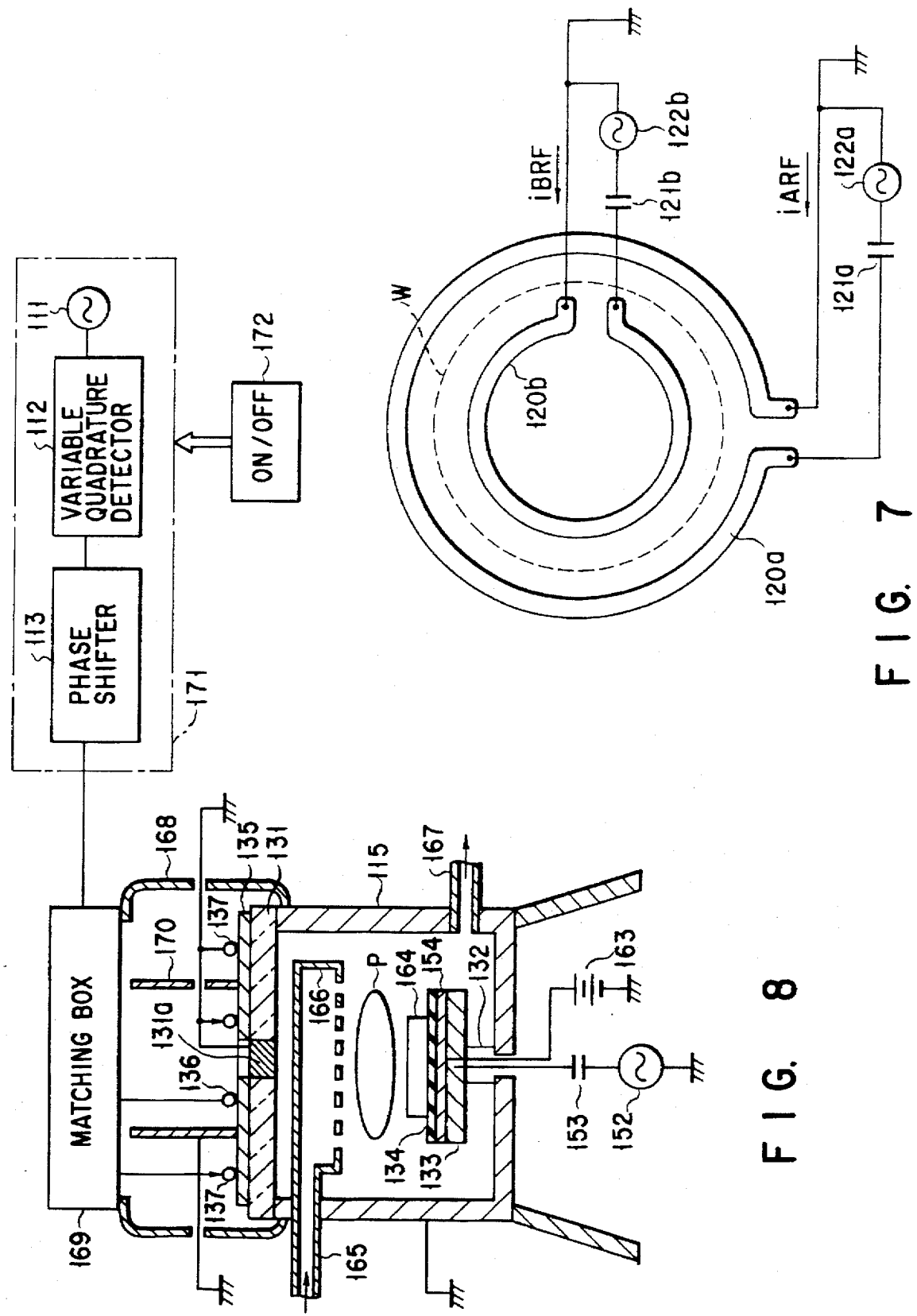
FIG. 7 is a view showing a double ring antenna applicable to the plasma equipment of FIGS. 1, 4 and 5.
FIG. 8 is a schematically sectional view of the plasma equipment provided with a double ring antenna according to the fourth embodiment of the present invention.

FIG. 7 exemplifies a case of using a double-antenna structure used in this embodiment. That is, an antenna 120 comprises two ring-shaped antennas 120a and 120b which are provided coaxially or, preferably, on the same surface. Between the terminals of the outer antenna 120a, a first high frequency power source 122a is connected through a capacitor 121a which serves as a matching circuit. Between the terminals of the inner antenna 120b, a second high frequency power source 122b is connected through a capacitor 121b which serves as a matching circuit.

The first and second high frequency power sources 122a and 122b have the same frequency, e.g. 13.56 $MH_z$, and supply first high frequency power and second high frequency power having the same phase as each other to the outer antenna 120a and the inner antenna 120b, respectively. Here, since the second high frequency power is set lower than the first high frequency power, larger amounts of current flow through the outer antenna 120a than the inner antenna 120b. A plasma generation region which is in the chamber space right below the antennas, is shifted outside, compared with the case of using a single antenna. By using a double-antenna structure, more uniform plasma density can be provided in this embodiment.

FIG. 9 illustrates another embodiment wherein a double-antenna structure as shown in FIG. 8 is utilized. According to this embodiment, the bottom and side surfaces of a chamber 115 of the plasma processing equipment are made of aluminum, and an upper plate 131 comprises a cylindrical enclosed chamber made of quartz glass. A ground electrode 131a is provided airtightly at the center of the upper plate 131.

A cylindrical support member 132 consisting of an insulating member such as ceramics or quartz, is disposed at the center of the bottom surface of the chamber 115. A disc-shaped electrode substrate 133 made of, e.g. aluminum, is provided on the support member 132. A wafer chuck 134 formed of an insulating member such as ceramics is provided on the substrate 133.

A disc-shaped paramagnetic metal 135 for electrostatic shielding, made of, e.g. aluminum, is provided on the outer wall surface of the upper plate 131 of the chamber 115. An inner high frequency coil 136 of one turn and an outer high frequency coil 137 of one turn are arranged on the paramagnetic metal 135 through an insulating member. The paramagnetic metal 135 is grounded and capacitive coupling parasitically existing between the high frequency coils and plasma is prevented by voltage applied to the inner and outer high frequency coils. The inner and outer high frequency coils 136 and 137 have the same plane structure as that of the double antennas of FIG. 7.

A non-grounded terminal of a lower power source 152 is connected through a capacitor 153 to the electrode substrate 133. Between the electrode substrate 133 and the wafer holding base 134, an electrostatic chuck electrode 154 is embedded. The electrode 154 is kept to a positive potential by a DC power source 163. A wafer 164 is held on the wafer holding base 134.

A gas pipe 165 passes through the upper side of the chamber in an airtight manner and is connected to a shower head 166. A gas exhaust pipe 167 is provided on the lower side of the chamber 115. The lower portion of a cylindrical casing 168 is fixed to the upper side of the chamber 115, and a matching box unit 169 having a capacitor circuit for impedance matching is provided on the upper side of the casing 168. High frequency power of 13.56 $MH_z$ is supplied to the inner and outer high frequency coils 136 and 137 by way of the matching box 169.

An electromagnetic shield cylinder 170 made of aluminum or copper is provided between the inner and outer high frequency coils 136 and 137. It is provided for preventing mutual intervention of the electric field between the inner and outer high frequency coils 136 and 137. And the cylinder 137 is grounded.

Explanation will be given to the operation of the embodiment of FIG. 9.

An object, that is, semiconductor wafer 164 is held on the wafer holding base 134. The atmosphere in the chamber 115 is reduced to a predetermined degree of vacuum by way of a gas exhaust pipe 167, preparing for a state in which predetermined processing gas with a predetermined pressure and flow rate is supplied to the chamber 115 from the gas supply pipe 165.

An ON/OFF switch is turned on, and the power of 13.56 $MH_z$.3 kW is supplied from a high frequency power source 111 to a variable quadrature detector 112. The detector 112 divides the power of the high frequency power source 111 into two powers P1 and P2 which are supplied to a matching box 169 via a phase shifter 113. The matching box 169 supplies the powers P1 and P2 to coils 136 and 137, respectively. If high frequency current flows through the high frequency coils 136 and 137, an alternating field occurs around the coils. Most of the field passes through the center of the antennas (high frequency coils 136 and 137) in the longitudinal direction, and form a closed loop. The alternating field induces a concentric alternating electric field in the circumferential direction right under the high frequency coils 136 and 137. When electrons accelerated by the alternating fields in the circumferential direction collide with neutral particles of processing gas, gas is ionized to generate plasma. Then, ions, electrons and other active materials contained in plasma are supplied to or irradiated onto the entire surface of the semiconductor wafer 164 in a uniform manner. Thus, uniform plasma-processing is carried out to the entire surface of the wafer 164.

If it is necessary to change plasma distribution depending on the processing types, e.g. discharge processing, cleaning processing or etching processing, an optimum plasma distribution can be formed by adjusting phases of powers P1 and P2 using the phase shifter 113 in accordance with the processing types.

As explained in the embodiment, if the ground electrode 131a is arranged at the upper plate 131 and phases of powers P1 and P2 supplied to the high frequency coils 136 and 137 are changed, then the density distribution of fields induced in the chamber 115 and consequently etching processing become more uniform. As shown in the last embodiment, if the processing gas supply path is provided at the ground electrode 131a and through the path, processing gas is introduced, then the gas flow rate and consequently processing become far more uniform.

The embodiment of the present invention have been described, referring to a plasma etching apparatus. However, the present invention can be applied to various plasma processing apparatuses such as a plasma CVD apparatus, a plasma ashing apparatus and a plasma sputtering apparatus. Also, as an object, not only a semiconductor wafer but an LCD substrate or the like can be used.

According to the present invention as described above, the induction type plasma processing apparatus, which is provided with the ground electrode, can change the field intensity distribution, making a reaction speed uniform to thereby realize uniform processing to the object. For instance, if etching processing is carried out, the present invention can compensate for a decrease in the etching rate at the center of the object, so that etching processing can be carried out to the object with uniform etching rate, whether the center or the periphery of the object.

Since the ground electrode is provided at the center of the high frequency antenna, the bias field at the center thereof can be intensified and reaction speed at the center of the object can be increased without influencing the generation of plasma. Besides, since the bias field can be changed arbitrarily and continuously, desired field intensity distribution can be easily obtained.

Since the processing gas supply port is provided at the ground electrode, the processing gas flow on the object can be orientated, for example, from the center to the periphery, and uniform processing can be given to the object. Besides, since the intensity distribution of the bias field is improved to be uniform, the processing uniformity can be improved accordingly.

Since the ground electrode is formed to be flush with the inner wall of the processing chamber, it does not affect the generation and distribution of plasma and processing uniformity is thereby improved further. Due to a plurality of supply ports provided at the ground electrode, processing gas is introduced into the processing chamber from the plural ports and the gas flow becomes more uniform consequently contributing to uniform processing. Since the ground electrode is grounded irrespective of the processing gas supply path, generated plasma and the bias field are far more stabilized and lead to more stable, uniform processing.

Moreover, since the ground electrode is grounded through the variable load circuit equipment, the bias field distribution can be arbitrarily controlled, making it possible to make finite adjustment to the detailed process. Due to the gas supply ports provided on the upper and side surfaces of the housing, processing gas is introduced into the processing chamber from two directions, i.e. upward and lateral directions. As a result, even if uneven gas flow occurs, it can be compensated to be uniform.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A plasma processing apparatus comprising:

a chamber having an upper wall in which an object is placed; gas supply means having a gas supply pipe to said object for supplying processing gas into said chamber;

a high-frequency antenna of one of a spiral type, a coiled type and a looped type, provided on at least one of inside and outside of said upper wall of said chamber to oppose said object, for ionizing processing gas supplied into said chamber for processing said object;

a high-frequency power source for supplying high-frequency power to said high-frequency antenna; and an electrode mounted on said upper wall of said chamber to oppose said object on a center of said high-frequency antenna and to be insulated from said high-frequency antenna and set at a reference potential, for providing a uniform electric field above said object, and wherein said gas supply means includes at least one gas supply path provided in said electrode and communicating with said gas supply pipe.

2. A plasma processing apparatus according to claim 1, wherein said upper wall of said chamber is formed of a dielectric plate.

3. A plasma processing apparatus according to claim 2, wherein said electrode is connected to a grounding electrode.

4. A plasma processing apparatus according to claim 3, further comprising a reference potential adjustment circuit, connected between said electrode and said grounding electrode, for controlling potential of said electrode.

5. A plasma processing apparatus according to claim 2, wherein said electrode is provided on said dielectric plate to be flush with said dielectric plate.

6. A plasma processing apparatus according to claim 2, further comprising an electrostatic shield plate interposed between said antenna and said dielectric plate.

7. A plasma processing apparatus according to claim 1, wherein said gas supply pipe has a supply port communicating with said gas supply path of to introduce said processing gas into a central portion of said object.

8. A plasma processing apparatus according to claim 1, wherein said gas supply means has a hollow portion communicating with said gas supply path and a plurality of supply ports communicating with said hollow portion to introduce said processing gas into a central portion of said object.

9. A plasma processing apparatus according to claim 1, wherein said antenna comprises one of a spiral antenna, a coiled antenna and a looped antenna.

10. A plasma processing apparatus according to claim 1, wherein said antenna comprises a plurality of ring-shaped antenna elements which are arranged coaxially, and said high-frequency power source supplies two high-frequency electric powers, which are the same in frequency and phase, to said antenna elements, respectively.

11. A plasma processing apparatus according to claim 10, wherein said antenna elements have an inner antenna element and an outer antenna element, and said high-frequency power source supplies larger amounts of a high frequency current to said outer antenna than said inner antenna.

* * * * *